US012538740B2

(12) United States Patent
Sun et al.

(10) Patent No.: US 12,538,740 B2
(45) Date of Patent: Jan. 27, 2026

(54) TEMPERATURE COMPENSATION SYSTEM, SEMICONDUCTOR DEVICE AND TEMPERATURE COMPENSATION METHOD

(71) Applicant: SHENYANG KINGSEMI Co., Ltd., Shenyang (CN)

(72) Inventors: Yuanbin Sun, Shenyang (CN); Xinglong Chen, Shenyang (CN); Yunhe Jiang, Shenyang (CN); Yu Han, Shenyang (CN)

(73) Assignee: SHENYANG KINGSEMI Co., Ltd., Shenyang (CN)

( * ) Notice: Subject to any disclaimer, the term of this patent is extended or adjusted under 35 U.S.C. 154(b) by 715 days.

(21) Appl. No.: 17/918,772

(22) PCT Filed: Jun. 29, 2022

(86) PCT No.: PCT/CN2022/102413
§ 371 (c)(1),
(2) Date: Oct. 13, 2022

(87) PCT Pub. No.: WO2024/000284
PCT Pub. Date: Jan. 4, 2024

(65) Prior Publication Data
US 2024/0222167 A1    Jul. 4, 2024

(51) Int. Cl.
*H01L 21/67* (2006.01)
*G05D 23/19* (2006.01)

(52) U.S. Cl.
CPC ....... *H01L 21/67248* (2013.01); *G05D 23/19* (2013.01); *H01L 21/67109* (2013.01)

(58) Field of Classification Search
CPC ............... H01L 21/67; H01L 21/67103; H01L 21/67248; H01L 21/67109; G05D 23/19
See application file for complete search history.

(56) References Cited

U.S. PATENT DOCUMENTS

2019/0088517 A1 *  3/2019  Kosakai ............ H01L 21/67103

* cited by examiner

*Primary Examiner* — Harry E Arant
(74) *Attorney, Agent, or Firm* — ZIEGLER IP LAW GROUP, LLC.

(57) ABSTRACT

The disclosure provides a temperature compensation system, including a cavity, a temperature feedback module, a heating plate, a main heating module, a multi-zone temperature control module, a distributed temperature control module and at least one auxiliary temperature adjustment module, wherein at least one temperature control compensation area is arranged at a bottom surface of the heating plate, and the auxiliary temperature adjustment module and the temperature control compensation area are arranged in a correspondence manner; the temperature feedback module performs temperature detection on the heating plate to obtain a first temperature value and a second temperature value; the multi-zone temperature control module controls the main heating module to perform temperature adjustment on the heating plate according to the first temperature value, and the distributed temperature control module controls the auxiliary temperature adjustment module to perform temperature compensation adjustment on the temperature control compensation area according to the second temperature value. Complicated outgoing design is avoided, less volume space is occupied, the cost is reduced and the temperature control accuracy is high. The disclosure further provides a semiconductor device and a temperature compensation method.

12 Claims, 4 Drawing Sheets

TEMPERATURE COMPENSATION SYSTEM, SEMICONDUCTOR DEVICE AND TEMPERATURE COMPENSATION METHOD

FIELD OF TECHNOLOGY

The disclosure relates to the field of semiconductor manufacturing, in particular to a temperature compensation system, a semiconductor device and a temperature compensation method.

BACKGROUND

Currently, a substrate baking unit is frequently used in a wafer baking process in a semiconductor manufacturing procedure. In a heating and baking process, the temperature uniformity of the substrate is of great importance in achieving the technological indexes of the substrate. Therefore, it is equally important to effectively adjust the temperature uniformity of the substrate.

Currently, a conventional solution for adjusting the temperature of the substrate in the industry is to optimize the heating circuit of the heater and appropriately increase the number of zones of the heater to improve the temperature uniformity of a heating plate. However, this solution has its limitations, and it is impossible to improve the temperature uniformity during the wafer baking process by a large margin by simply optimizing circuit layout of the heater, optimizing the peripheral hardware structure of the heater, and even performing some necessary thermal-field analysis. If the temperature uniformity in the wafer baking process is greatly improved, the adopted solution is to increase the number of zones of the heater, so that different heater zones can be respectively controlled by a multi-zone temperature control system. However, this traditional solution greatly prolongs the development cycle of the heater, increases the cost expenditure of the research and development of the heater, and has more strict control on the manufacturing process of the heater, thereby causing the yield of the heaters to be reduced, and higher prices of the multi-zone high-precision heaters. On the other hand, with the adoption of this solution of increasing the number of the zones and optimizing the heating circuit, the number of power lines and outgoing lines of the temperature measurement sensor are increased, the wiring is more complicated, and the design difficulty of the peripheral structure of the heater is increased; when the number of the zones of the heater is increased, the cost of the temperature control part can be greatly increased, and meanwhile, a large space for hardware installation is occupied.

Therefore, it is necessary to provide a temperature compensation system, a semiconductor device and a temperature compensation method to solve the above-mentioned problems in the prior art.

SUMMARY

The objective of the disclosure is to provide a temperature compensation system, a semiconductor device and a temperature compensation method to solve the problems that the cost of substrate temperature adjustment is high and a large space for hardware installation is occupied in the prior art.

To achieve the above purpose, the temperature compensation system includes a cavity, a temperature feedback module, a heating plate, a multi-zone temperature control module, a distributed temperature control module, a main heating module for heating the heating plate, and at least one auxiliary temperature adjustment module, wherein the cavity and a bottom surface of the heating plate form an installation cavity, the main heating module, the auxiliary temperature adjustment module and the distributed temperature control module are arranged in the installation cavity, the distributed temperature control module is in communication connection with the temperature feedback module and the auxiliary temperature adjustment module, and the multi-zone temperature control module is in communication connection with the temperature feedback module and the main heating module;

at least one temperature control compensation area is arranged at the bottom surface of the heating plate, and the auxiliary temperature adjustment module and the temperature control compensation area are arranged in a correspondence manner;

the temperature feedback module performs temperature detection on the heating plate to obtain a first temperature value and a second temperature value;

the multi-zone temperature control module controls the main heating module to perform temperature adjustment on the heating plate according to the first temperature value;

the distributed temperature control module controls the auxiliary temperature adjustment module to perform temperature compensation adjustment on the temperature control compensation area according to the second temperature value.

The temperature compensation system of the disclosure has the beneficial effects that:

The auxiliary temperature adjustment module is correspondingly arranged in the temperature control compensation area to perform temperature compensation adjustment on the heating plate, so that the complicated outgoing design is avoided, the occupied volume space is small, and the problems of high substrate temperature adjustment cost and large hardware installation space in the prior art are solved. The temperature feedback module detects the heating plate to obtain a first temperature value and a second temperature value, the multi-zone temperature control module controls the main heating module to perform temperature adjustment on the heating plate according to the first temperature value, and the distributed temperature control module controls the auxiliary temperature adjustment module to perform temperature adjustment on the temperature control compensation area according to the second temperature value; through temperature adjustment and temperature compensation adjustment, the temperature of the heating plate is more uniform, the temperature uniformity of the semiconductor substrate is effectively controlled with as little manufacturing and maintenance cost as possible, and the temperature control accuracy is high.

the temperature feedback module performs, after heating power of the main heating module is stable, a first round of temperature detection on the heating plate to obtain the first temperature value, and feeds the first temperature value back to the multi-zone temperature control module;

after the temperature adjustment is completed, the temperature feedback module performs a second round of temperature detection on the heating plate to obtain the second temperature value, and feeds the second temperature value back to the distributed temperature control module.

Alternatively, the temperature compensation system further includes a partition plate arranged between the main heating module and the distributed temperature control module, wherein the auxiliary temperature adjustment module is arranged at the partition plate.

Alternatively, the partition plate is provided with a lead hole to allow a lead to pass therethrough.

Alternatively, the auxiliary temperature adjustment module comprises a temperature compensation unit, the temperature compensation unit is in communication connection with the distributed temperature control module, and the distance between the temperature compensation unit and the corresponding temperature control compensation area is greater than or equal to 0.

Alternatively, the auxiliary temperature adjustment module further includes a fixing assembly, wherein the fixing assembly is used for fixing the temperature compensation unit to the corresponding temperature control compensation area.

Alternatively, the auxiliary temperature adjustment module further comprises a supporting piece arranged on the partition plate, an elastic piece arranged inside the supporting piece and an installation part arranged at a top end of the elastic piece, and the temperature compensation unit is arranged on a side of the installation part facing the heating plate;

under the action of the supporting piece, the elastic piece applies a force to the temperature compensation unit in a direction towards the corresponding temperature control compensation area to adjust the distance between the temperature compensation unit and the corresponding temperature control compensation area.

Alternatively, the supporting piece is internally provided with a lead hole to allow a lead to pass therethrough.

Alternatively, the temperature compensation unit comprises a heating unit and a cooling unit, and the heating unit and the cooling unit are arranged in a spaced manner.

Alternatively, when the second temperature value is less than a preset second target temperature, the distributed temperature control module controls the heating unit to perform temperature compensation adjustment to the temperature control compensation area corresponding to the second temperature value.

Alternatively, when the second temperature value is greater than a preset second target temperature, the distributed temperature control module controls the cooling unit to perform temperature compensation adjustment on the temperature control compensation area corresponding to the second temperature value.

Alternatively, the temperature compensation system further includes a temperature control plate arranged in the installation cavity, wherein the temperature control plate is at a bottom end of the heating plate, a thermal insulation space is formed among the temperature control plate, the heating plate and an inner side wall of the installation cavity, and the distributed temperature control module and the auxiliary temperature adjustment module are both arranged in the thermal insulation space.

Alternatively, a top surface of the heating plate includes a substrate contact area, and the bottom surface of the heating plate includes a bottom surface control area corresponding to the substrate contact area, and the temperature control compensation area is any area within the bottom surface control area.

The disclosure further provides a semiconductor device including the temperature compensation system.

The disclosure further provides a temperature compensation method, which includes the following steps:

S0, providing a heating plate, a main heating module and an auxiliary temperature adjustment module, wherein at least one temperature control compensation area is arranged at a bottom surface of the heating plate, and the auxiliary temperature adjustment module and the temperature control compensation area are arranged in a correspondence manner;

S1, performing temperature detection on the heating plate to obtain a first temperature value and a second temperature value;

S2, controlling the main heating module to perform temperature adjustment on the heating plate according to the first temperature value;

S3, controlling the auxiliary temperature adjustment module to perform temperature compensation adjustment on the temperature control compensation area according to the second temperature value.

DESCRIPTION OF THE EMBODIMENTS

In order to make objectives, technical solutions, and advantages of the disclosure clearer, the technical solutions in the disclosure are described clearly and completely in the following. Apparently, the described embodiments are only part rather than all of the embodiments of the disclosure. On the basis of the embodiments of the present disclosure, all other embodiments acquired by those of ordinary skill in the art without making inventive efforts fall within the scope of protection of the present disclosure. Unless otherwise mentioned, all technical and scientific terms used herein have the same meaning as commonly understood by one of ordinary skill in the art to which the invention belong. As used herein, "comprising", "including" and the similar words mean that elements or articles appearing before the word encompass the elements or articles or equivalents thereof listed after the word, but do not exclude other elements of articles.

Figure 1:
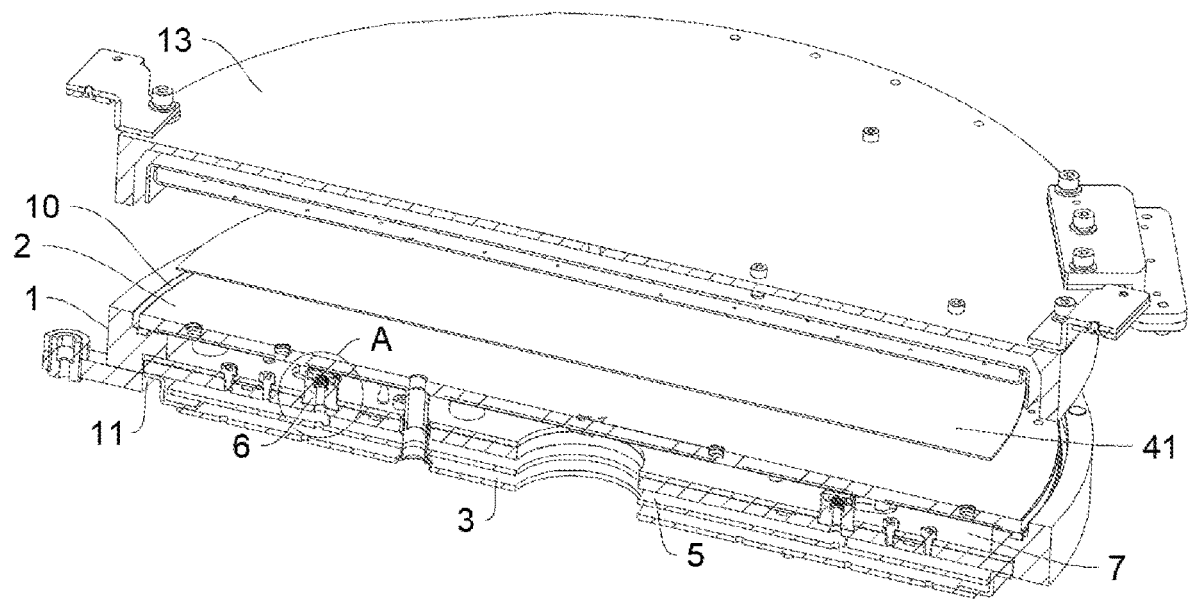
FIG. 1 is a sectional structural diagram of a temperature compensation system according to an embodiment of the disclosure.

Aiming at the problems in the prior art, an embodiment of the disclosure provides a temperature compensation system. FIG. 1 is a sectional structural diagram of the temperature compensation system of the embodiment of the disclosure, and FIG. 2 is a block diagram of circuit connection of the temperature compensation system of the embodiment of the disclosure.

Figure 2:
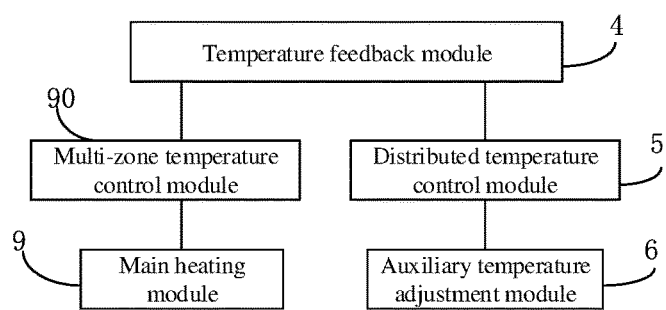
FIG. 2 is a block diagram of circuit connection of a temperature compensation system according to an embodiment of the disclosure.

Referring to FIG. 1 and FIG. 2, the temperature compensation system of the disclosure includes a cavity 1, a temperature feedback module 4, a heating plate 2, a distributed temperature control module 5, a multi-zone temperature control module 90, a main heating module 9 for heating the heating plate 2 and at least one auxiliary temperature adjustment module 6;

the cavity 1 and a bottom surface of the heating plate 2 form an installation cavity 11, and the main heating module 9, the auxiliary temperature adjustment module 6 and the distributed temperature control module 5 are arranged in the installation cavity 11;

referring to FIG. 2, the distributed temperature control module 5 is in communication connection with the temperature feedback module 4 and the auxiliary temperature adjustment module 6, and the multi-zone temperature control module 90 is in communication connection with the temperature feedback module 4 and the main heating module 9.

In some embodiments, the heating plate 2 is made of heat conductive material, which facilitates temperature adjustment on the heating plate 2 by the main heating module 9.

In some specific embodiments, the shape of the main heating module 9 is consistent with that of the heating plate 2, and the heating plate 2 is seamlessly connected with the main heating module to improve the temperature adjustment efficiency.

In some embodiments, the main heating module and the heating plate 2 are connected by a sintering process.

In a specific embodiment, the main heating module 9 is embedded into the heating plate 2 by the sintering process, that is, the main heating module 9 is embedded in a middle layer of the heating plate 2.

In another embodiment, the main heating module is sintered on the back of the heating plate 4 by the sintering process, so that the main heating module is seamlessly connected with the heating plate 2.

In other embodiments, the main heating module 9 is connected with the heating plate 2 by bonding or welding.

Referring to FIG. 1 and FIG. 2, at least one temperature control compensation area (not shown in the figure) is arranged on the bottom surface of the heating plate 2, and the auxiliary temperature adjustment module 6 and the temperature control compensation area are arranged in a correspondence manner.

In some specific embodiments, the specific range of the temperature control compensation area and the distance between adjacent temperature control compensation areas are co-determined by the structural performance, technological requirements and installation conditions of the heating plate 2 itself.

the temperature feedback module 4 performs temperature detection on the heating plate 2 to obtain a first temperature value and a second temperature value;

The multi-zone temperature control module 90 controls the main heating module 9 to perform temperature adjustment on the heating plate 2 according to the first temperature value;

the distributed temperature control module 5 controls the auxiliary temperature adjustment module 6 to perform temperature compensation adjustment on the temperature control compensation area according to the second temperature value.

In some embodiments, the distributed temperature control module 5 includes a control board composed of a Printed Circuit Board (PCB) and functional devices arranged at the PCB.

The temperature compensation system of the disclosure has the advantages that the auxiliary temperature adjustment module 6 is correspondingly arranged in the temperature control compensation area to perform temperature compensation adjustment on the heating plate 2, so that the complicated outgoing design is avoided, the occupied volume space is small, and the problems of high substrate temperature adjustment cost and large hardware installation space in the prior art are solved. The temperature feedback module 4 detects the heating plate 2 to obtain a first temperature value and a second temperature value, the multi-zone temperature control module 90 controls the main heating module 9 to perform temperature adjustment on the heating plate 2 according to the first temperature value, and the distributed temperature control module 5 controls the auxiliary temperature adjustment module 6 to perform temperature compensation adjustment on the temperature control compensation area according to the second temperature value, so that the temperature of the heating plate 2 is more uniform, the temperature uniformity of the semiconductor substrate can be effectively controlled with as little manufacturing and maintenance cost as possible, and the temperature control accuracy is high. The number of zones increased by adopting a traditional technical solution and the cost of the temperature control part can be effectively reduced.

As an alternative embodiment of the disclosure, a top surface of the heating plate 2 includes a substrate contact area, and the bottom surface of the heating plate 2 includes a bottom surface control area corresponding to the substrate contact area, and the temperature control compensation area is any area within the bottom surface control area.

In some embodiments, the heating plate 2 is provided with a plurality of heating zones, and the main heating module 9 is provided with a multi-zone heating circuit, which facilitates heating the plurality of heating zones.

Figure 3:
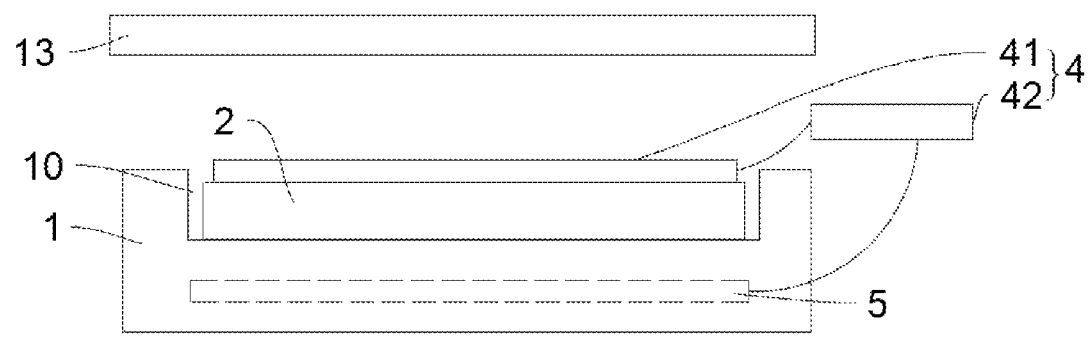
FIG. 3 is a structural diagram of a temperature feedback module and a distributed temperature control module according to an embodiment of the disclosure.

FIG. 3 is a structural diagram of a temperature feedback module and a distributed temperature control module according to an embodiment of the disclosure.

In some embodiments, referring to FIG. 3, the temperature compensation system further includes a cover body 13, a heating cavity 10 is formed between the cover body 13 and the cavity 1, the heating cavity 10 is used for containing a wafer needing a wafer baking process or a temperature measurement wafer for temperature detection, the cover body 13 is used for covering the top of the heating cavity 10 to reduce heat loss, the heating plate 2 is arranged at the bottom of the heating cavity 10, the distributed temperature control module 5 is located at the bottom of the heating plate 2, and the distributed temperature control module 5 is not in contact with the heating plate 2.

As an alternative embodiment of the disclosure, referring to FIG. 1 and FIG. 2, after the heating power of the main heating module 9 is stable, the temperature feedback module 4 performs the first round of temperature detection on the heating plate 2 to obtain the first temperature value, and feeds the first temperature value back to the multi-zone temperature control module 90;

after the temperature adjustment is completed, the temperature feedback module 4 performs a second round of temperature detection on the heating plate 2 to obtain the second temperature value, and feeds the second temperature value back to the distributed temperature control module 5.

In some embodiments, the temperature feedback module 4 includes a temperature measurement wafer 41 and a temperature measurement sensor 42, the temperature measurement wafer 41 is connected with the temperature measurement sensor 42, and the temperature measurement sensor 42 is in communication connection with the distributed temperature control module 5.

In some embodiments, the temperature feedback module 4 performs the first round of temperature detection as follows:

after the heating power of the main heating module 9 is stable, the temperature measurement wafer 41 is placed in the heating cavity 10 on the top surface of the heating plate 2, the temperature measurement wafer 41 is measured by the temperature measurement sensor 42 to perform the first round of temperature detection on the heating plate 2 to obtain the first temperature value, and the first temperature value is fed back to the multi-zone temperature control module 90.

In some embodiments, the multi-zone temperature control module 90 controls the main heating module 9 according to the first temperature value to perform temperature adjustment on the heating plate 2, wherein the specific adjustment steps are as follows:

when the first temperature value is less than a preset first target temperature, the multi-zone temperature control module 90 controls the main heating module 9 to increase its heating power, so as to increase the temperature of the heating plate 2 until the first temperature value is adjusted to the first target temperature, and the output power of the main heating module 9 is kept stable;

when the first temperature value is greater than the preset first target temperature, the multi-zone temperature control module 90 controls the main heating module 9 to reduce its heating power, so as to reduce the temperature of the heating plate 2 until the first temperature value is adjusted to the first target temperature, and the output power of the main heating module 9 is kept stable.

In some embodiments, referring to FIG. 2 and FIG. 3, the temperature feedback module 4 performs the second round of temperature detection as follows:

after the temperature adjustment is completed, the temperature measurement wafer 41 is placed in the heating cavity 10 at the top of the heating plate 2, and the temperature of the temperature measurement wafer 41 is detected by the temperature measurement sensor 42 to realize the temperature detection on the heating plate 2; after obtaining the second temperature value, the temperature measurement sensor 42 feeds back the second temperature value to the distributed temperature control module 5.

In some embodiments, the temperature measurement wafer 41 is provided with a plurality of temperature measurement points, each of the temperature measurement points is connected with at least one temperature measurement sensor 42, and the temperature control compensation areas correspond to the temperature measurement points to detect whether various areas of the heating plate 2 need temperature compensation adjustment, so as to perform temperature detection on the temperature control compensation areas separately and perform temperature compensation adjustment on the temperature control compensation areas needing temperature compensation, thereby facilitating the orderly temperature compensation adjustment on the heating plate 2.

In some specific embodiments, several temperature control compensation areas are distributed in an array manner relative to the center of the bottom surface control area. Specific array distribution types include, but are not limited to, a circular array and a rectangular array.

As an alternative embodiment of the disclosure, referring to FIG. 1, the temperature compensation system also includes a partition plate 7 arranged between the main heating module and the distributed temperature control module 5, wherein the auxiliary temperature adjustment module 6 is arranged at the partition plate 7.

In some embodiments, the partition plate 7 is made of a heat insulation material, and an outer side edge of the partition plate 7 is in sealing connection with a lower side wall of the heating plate 2 to play a role of heat insulation, thus, while reducing heat loss in the heating cavity 10, preventing the heat in the heating cavity 10 from affecting the work of the distributed temperature control module 5, and prolonging the service life of the distributed temperature control module 5.

As an alternative embodiment of the disclosure, the partition plate 7 is provided with a lead hole to allow a lead to pass therethrough.

Figure 4:
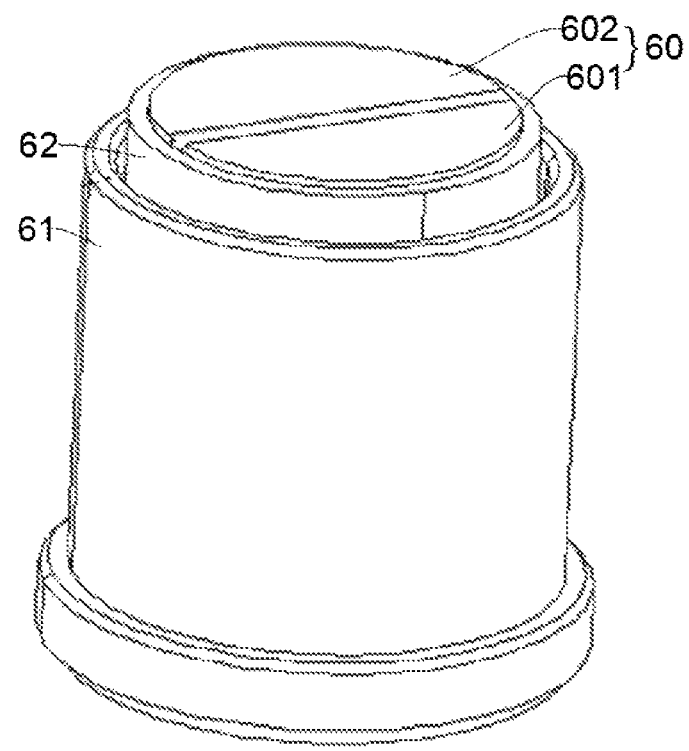
FIG. 4 is a front view of an auxiliary temperature adjustment module according to an embodiment of the disclosure.
Figure 5:
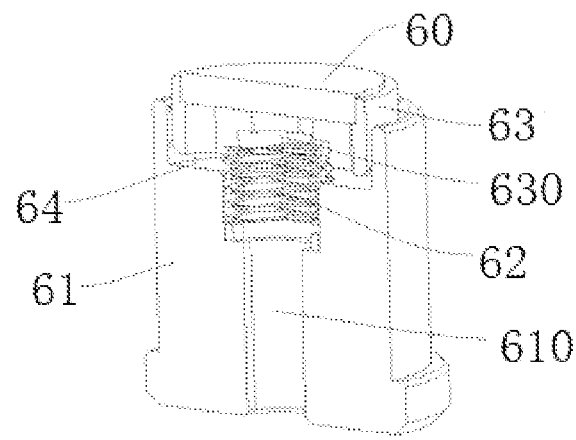
FIG. 5 is a sectional view of an auxiliary temperature adjustment module according to an embodiment of the disclosure.
Figure 6:
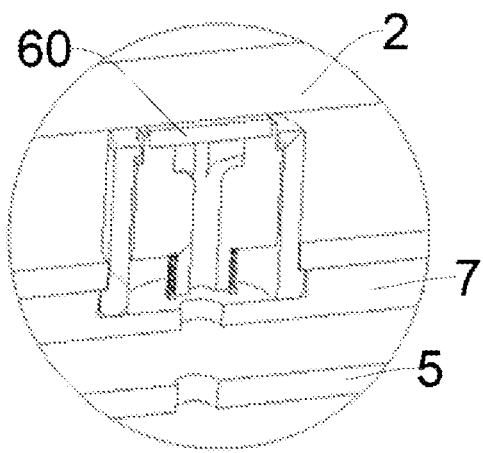
FIG. 6 is an enlarged structural diagram of a portion A in FIG. 1.

FIG. 4 is a front view of the auxiliary temperature adjustment module according to an embodiment of the disclosure, FIG. 5 is a sectional view of the auxiliary temperature adjustment module according to an embodiment of the disclosure, and FIG. 6 is an enlarged structural diagram of a portion A in FIG. 1.

As an alternative embodiment of the disclosure, referring to FIGS. 1, 4, 5 and 6, the auxiliary temperature adjustment module 6 includes a temperature compensation unit 60, the temperature compensation unit 60 is in communication connection with the distributed temperature control module 5, and a distance between the temperature compensation unit 60 and the corresponding temperature control compensation area is greater than or equal to 0.

As an alternative embodiment of the disclosure, the auxiliary temperature adjustment module 6 further includes a fixing assembly (not shown in the figure), wherein the fixing assembly is used for fixing the temperature compensation unit 60 to the corresponding temperature control compensation area.

As an alternative embodiment of the disclosure, referring to FIG. 4, the temperature compensation unit 60 includes a heating unit 601 and a cooling unit 602, and the heating unit 601 and the cooling unit 602 are arranged in a spaced manner.

In some embodiments, the temperature compensation unit 60 interacts with the heating plate 2 in a contact manner, that is, a distance between a top end of the temperature compensation unit 60 and the corresponding temperature control compensation area (not shown in the figure) is equal to 0, so that the top end of the temperature compensation unit 60 is attached to the temperature control compensation area (not shown in the figure).

In some specific embodiments, the fixing assembly is a high-temperature resistant adhesive, and the temperature compensation unit 60 is attached to the temperature control compensation area corresponding to the bottom surface of the heating plate 2 through the high-temperature resistant adhesive. The high-temperature resistant adhesive can keep good viscosity in a high temperature environment, ensuring that the temperature compensation unit 60 is attached to the bottom surface of the heating plate 2, and the temperature compensation adjustment effect is better.

In some specific embodiments, the heating unit 601 of the temperature compensation unit 60 is a ceramic heating sheet.

In some specific embodiments, the cooling unit 602 of the temperature compensation unit 60 is a semiconductor refrigerating sheet.

In other embodiments, the temperature compensation unit 60 is suspended between the heating plate 2 and the distributed temperature control module 5 through the fixing assembly, so that the distance between the top end of the temperature compensation unit 60 and the corresponding temperature control compensation area is greater than 0. The temperature compensation unit 60 interacts with the heating plate 2 in a non-contact manner.

In some specific embodiments, the heating unit 601 of the temperature compensation unit 60 is an LED lamp or a halogen lamp.

As an alternative embodiment of the disclosure, when the second temperature value is less than a preset second target temperature, the distributed temperature control module 5 controls the heating unit 601 to perform temperature compensation adjustment on the heating zone until the second temperature value is adjusted to the second target temperature;

when the second temperature value is greater than the preset second target temperature, the distributed temperature control module 5 controls the cooling unit 602 to perform temperature compensation adjustment on the heating zone until the second temperature value is adjusted to the second target temperature.

In some embodiments, the cooling unit 602 of the temperature compensation unit 60 is a small gas supply assembly.

In some embodiments, the small gas supply assembly is configured to spray clean refrigerant gas to the corresponding temperature control compensation area under the control of the distributed temperature control module 5.

In some specific embodiments, the small gas supply assembly includes a gas circulation pipeline corresponding to each temperature control compensation area, and the small gas supply assembly is arranged to circulate clean refrigerant gas in the gas circulation pipeline through the gas circulation pipeline under the control of the distributed temperature control module 5, so as to cool the corresponding temperature control compensation area; the gas circulation pipeline is close to or attached to the back of the heating plate 2 to improve the cooling effect.

In other embodiments, the cooling unit 602 of the temperature compensation unit 60 is a small liquid supply assembly.

In some specific embodiments, the small liquid supply assembly includes a liquid circulation pipeline corresponding to each temperature control compensation area, and the small liquid supply assembly is arranged to circulate refrigeration liquid in the liquid circulation pipeline under the control of the distributed temperature control module 5, so as to reduce the temperature of the corresponding temperature control compensation area; the liquid circulation pipeline is close to or attached to the back of the heating plate 2 to improve the cooling effect.

As an alternative embodiment of the disclosure, referring to FIG. 5, the auxiliary temperature adjustment module 6 further includes a supporting piece 61 arranged on the partition plate 7, an elastic piece 62 arranged inside the supporting piece 61, and an installation part 63 arranged at a top end of the elastic piece 62, and the temperature compensation unit 60 is arranged on a side of the installation par 63 facing the heating plate 2.

under the action of the supporting piece 61, the elastic piece 62 applies a force to the temperature compensation unit 60 in a direction towards the corresponding temperature control compensation area to adjust the distance between the temperature compensation unit 60 and the corresponding temperature control compensation area.

In some embodiments, the supporting piece 61 is internally provided with a groove 64 that allows the installation part 63 to slide in the direction away from or close to the bottom surface of the heating plate 2, and the elastic piece 62 is arranged in the groove 64. The groove 64 defines a radial movement range of the installation part 63, so as to adjust the distance between the temperature compensation unit 60 and the temperature control compensation area as required, so that the temperature compensation unit 60 can effectively act on the corresponding temperature control compensation area.

In some embodiments, the elastic piece 62 is in a compressed working state, so as to apply a force to the temperature compensation unit 60 in a direction towards the corresponding temperature control compensation area (not shown in the figure), to allow the top end of the temperature compensation unit 60 to be attached to the corresponding temperature control compensation area (not shown in the figure).

In some specific embodiments, the elastic piece 62 is a spring.

As an alternative embodiment of the disclosure, the supporting piece 61 is internally provided with a lead hole to allow a lead to pass therethrough, and the installation part 63 is also internally provided with a lead hole to allow a lead to pass therethrough.

In some embodiments, referring to FIG. 5, the partition plate 7 is provided with a first lead hole (not shown in the figure) to allow a lead to pass therethrough, the supporting piece 61 is internally provided with a second lead hole 610 to allow a lead to pass therethrough, and the installation part 63 is internally provided with a third lead hole 630 to allow a lead to pass therethrough, so that the temperature compensation unit 60 can respectively pass through the third lead hole 630, the groove 64, the second lead hole 610 and the first lead hole via the lead to be connected with the distributed temperature control module 5, so that the communication connection between the temperature compensation unit 60 and the distributed temperature control module 5 is realized.

As an alternative embodiment of the disclosure, referring to FIG. 1, the temperature compensation system further includes a temperature control plate 3, wherein the temperature control plate 3 is arranged in the installation cavity 11, the temperature control plate 3 is located at a bottom end of the heating plate 2, a thermal insulation space is formed among the temperature control plate 3, the heating plate 2 and an inner wall of the heating cavity 10, and the distributed temperature control module 5 and the auxiliary temperature adjustment module 6 are both arranged in the thermal insulation space.

In some embodiments, the temperature control plate 3 is made of a heat insulation material, and an outer side surface of the temperature control plate 3 is in sealing connection with an inner side wall of the heating cavity 10 to be able to form a thermal insulation space with the heating plate 2 and the inner wall of the heating cavity 10, so that the temperature in the heating cavity 10 can be maintained more easily, thereby ensuring the temperature stability in the semiconductor substrate processing process, and achieving the effect of saving electricity and energy; the temperature control plate 8 further plays the role of sealing protection, so as to protect circuit components such as the distributed temperature control module 5 and the auxiliary temperature adjustment module 6 located between the heating plate 2 and the temperature control plate 3.

The disclosure further provides a semiconductor device including the temperature compensation system.

Figure 7:
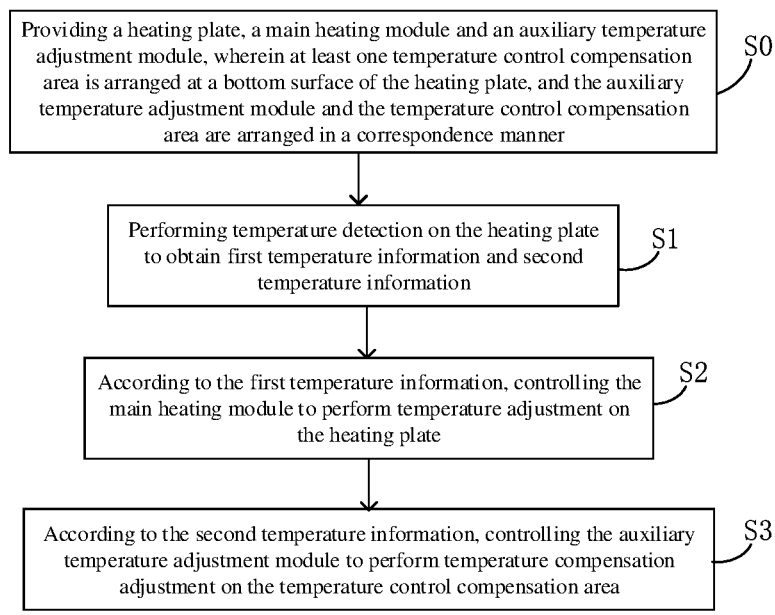
FIG. 7 is a flowchart of a temperature compensation method according to an embodiment of the disclosure.

FIG. 7 is a flowchart of a temperature compensation method according to an embodiment of the disclosure.

Referring to FIG. 7, the disclosure further provides a temperature compensation method, which includes the following steps:

S0, providing a heating plate, a main heating module and an auxiliary temperature adjustment module, wherein at least one temperature control compensation area is arranged at a bottom surface of the heating plate, and the auxiliary temperature adjustment module and the temperature control compensation area are arranged in a correspondence manner;

S1, performing temperature detection on the heating plate to obtain a first temperature value and a second temperature value;

S2, controlling the main heating module to perform temperature adjustment on the heating plate according to the first temperature value;

S3, controlling the auxiliary temperature adjustment module to perform temperature compensation adjustment on the temperature control compensation area according to the second temperature value.

In some embodiments, referring to FIG. 1 to FIG. 7, in combination with the temperature compensation system of the disclosure, a temperature compensation method of the disclosure includes the specific operation steps as follows:

(1) after the heating power of the main heating module 9 is stable, the temperature measurement wafer 41 is placed on the heating surface on the top surface of the heating plate 2, the temperature measurement wafer 41 is measured by the temperature measurement sensor 42 to perform the first round of temperature detection on the heating plate 2 to obtain the first temperature value, and the first temperature value is fed back to the multi-zone temperature control module 90.

(2) the multi-zone temperature control module 90 controls the main heating module 9 to perform temperature adjustment on the heating plate 2 according to the first temperature value, specifically as follows:

when the first temperature value is less than the preset first target temperature, the multi-zone temperature control module controls the main heating module to increase its heating power, so as to increase the temperature of the heating plate until the first temperature value is adjusted to the first target temperature, and the output power of the main heating module is kept stable;

when the first temperature value is greater than the preset first target temperature, the multi-zone temperature control module controls the main heating module to reduce its heating power, so as to reduce the temperature of the heating plate until the first temperature value is adjusted to the first target temperature, and the output power of the main heating module is kept stable.

(3) in the temperature compensation adjustment stage of the heating plate 2, that is, after the temperature adjustment is completed, several temperature measurement points on the temperature measurement wafer 41 are measured by several temperature measurement sensors 42 to obtain several second temperature values, and the measured second temperature values are fed back to the distributed temperature control module 5, so as to realize online monitoring of the temperatures in the temperature control compensation areas;

(4) according to the second temperature value, the distributed temperature control module 5 controls the auxiliary temperature adjustment module 6 to perform temperature compensation adjustment on the temperature control compensation area, specifically as follows:

when the second temperature value is less than the second target temperature, the distributed temperature control module 5 controls the heating unit 601 of the temperature control compensation area corresponding to the temperature measurement sensor 42 to heat up the temperature control compensation area, until the second temperature value corresponding to the temperature control compensation area is at the second target temperature;

when the second temperature value is greater than the second target temperature, the distributed temperature control module 5 controls the cooling unit 602 of the temperature control compensation area corresponding to the temperature measurement sensor 42 to cool the temperature control compensation area, until the second temperature value corresponding to the temperature control compensation area is at the second target temperature.

In the prior art, the temperature uniformity of the heating plate is usually adjusted by controlling the heating plate by zones. For example, the heating plate is divided into seven zones, thirteen zones, fifteen zones, etc. Considering the layout requirements of functional devices and the limitation of wiring and installation, the zones of the heating plate cannot be infinite, and each zone includes several temperature measurement sampling points on the temperature measurement wafer. When a certain zone is displayed through the temperature measurement wafer, if the temperature uniformity of the first zone does not meet the technological requirements, temperature adjustment is needed, then the main control unit will control the first zone to heat up. However, this adjustment will bring the following problems: an average temperature of some of the several temperature measurement sampling points included in the first zone will be lower than the target temperature, but temperatures of some of these temperature measurement sampling points will be higher than the target temperature, and the temperature differences between these temperatures and the target temperature are likely to be different from each other. The temperature differences between the temperatures of even the various temperature control areas with the temperatures lower than the target temperature and the target temperature are likely to be different from each other. It can be seen that the temperature adjustment on a single zone can easily cause the problem of uneven temperatures in the whole range of the heating plate again.

In addition, the above-mentioned manner of zone control enables each zone to require independent temperature control, which significantly increases the cost of the temperature control part; and the more zones are required, the more the heating devices are required, which significantly increases the cost of temperature control.

According to the technical solution of the embodiment of the disclosure, after the heating power of the main heating module 9 is stable, the first round of temperature detection of the heating plate 2 is performed by the temperature feedback module 4 to obtain the first temperature value, and the first temperature value is fed back to the multi-zone temperature control module 90, and the multi-zone temperature control module 90 controls the main heating module 9 to perform temperature adjustment on the heating plate 2 according to the first temperature value until the first temperature value is kept within the first temperature range;

after the temperature adjustment is completed, the temperature information of the temperature measurement wafer 41 is obtained by the temperature measurement sensor 42 to obtain a second temperature value, and several temperature control compensation areas at the bottom surface of the heating plate 2 that need temperature compensation adjustment are judged according to the second temperature value; finally, the distributed temperature control module 5 controls the corresponding temperature compensation units 60 to heat or cool the temperature control compensation areas, so as to achieve the purpose of temperature compensation adjustment until the second temperature value is kept at the second target temperature. Two rounds of temperature detection and two rounds of temperature adjustment on the heating plate are realized, and the functions of independent temperature measurement and independent temperature compensation adjustment on the temperature compensation units 60 are realized, so that the temperatures of the various temperature control compensation areas reach the preset temperature range, thus ensuring the temperature uniformity on the heating plate 2 and the temperature uniformity of each zone on the heating plate 2.

While the embodiments of the invention have been described in detail, it will be apparent to those skilled in the art that various modifications and changes can be made to the embodiments. However, it is to be understood that such modifications and variations are within the scope and spirit of the invention as described in the appended claims. Furthermore, the invention described herein is susceptible to other embodiments and may be embodied or carried out in various ways.

The invention claimed is:

1. A temperature compensation system, comprising a cavity, a temperature feedback module, a heating plate, a multi-zone temperature control module, a distributed temperature control module, a main heating module for heating the heating plate, and at least one auxiliary temperature adjustment module, wherein the cavity and a bottom surface of the heating plate form an installation cavity, the main heating module, the auxiliary temperature adjustment module and the distributed temperature control module are arranged in the installation cavity, the distributed temperature control module is in communication connection with the temperature feedback module and the auxiliary temperature adjustment module, and the multi-zone temperature control module is in communication connection with the temperature feedback module and the main heating module;

at least one temperature control compensation area is arranged at the bottom surface of the heating plate, and the auxiliary temperature adjustment module and the temperature control compensation area are arranged in a correspondence manner;

the temperature feedback module performs temperature detection on the heating plate to obtain a first temperature value and a second temperature value;

the multi-zone temperature control module controls the main heating module to perform temperature adjustment on the heating plate according to the first temperature value;

the distributed temperature control module controls the auxiliary temperature adjustment module to perform temperature compensation adjustment on the temperature control compensation area according to the second temperature value, wherein the temperature compensation system further comprises a partition plate arranged between the main heating module and the distributed temperature control module, wherein the auxiliary temperature adjustment module is arranged at the partition plate, wherein the auxiliary temperature adjustment module comprises a temperature compensation unit, the temperature compensation unit is in communication connection with the distributed temperature control module, and a distance between the temperature compensation unit and the corresponding temperature control compensation area is greater than or equal to 0, and wherein the auxiliary temperature adjustment module further comprises a supporting piece arranged on the partition plate, an elastic piece arranged inside the supporting piece and an installation part arranged at a top end of the elastic piece, and the temperature compensation unit is arranged on a side of the installation part facing the heating plate;

under the action of the supporting piece, the elastic piece applies a force to the temperature compensation unit in a direction towards the corresponding temperature control compensation area to adjust the distance between the temperature compensation unit and the corresponding temperature control compensation area.

2. The temperature compensation system of claim 1, wherein after heating power of the main heating module is stable, the temperature feedback module performs a first round of temperature detection on the heating plate to obtain the first temperature value, and feeds the first temperature value back to the multi-zone temperature control module;

after the temperature adjustment is completed, the temperature feedback module performs a second round of temperature detection on the heating plate to obtain the second temperature value, and feeds the second temperature value back to the distributed temperature control module.

3. The temperature compensation system of claim 1, wherein the partition plate is provided with a lead hole to allow a lead to pass therethrough.

4. The temperature compensation system of claim 1, wherein the auxiliary temperature adjustment module further comprises a fixing assembly, wherein the fixing assembly is used for fixing the temperature compensation unit to the corresponding temperature control compensation area.

5. The temperature compensation system of claim 1, wherein the supporting piece is internally provided with a lead hole to allow a lead to pass therethrough.

6. The temperature compensation system of claim 1, wherein the temperature compensation unit comprises a heating unit and a cooling unit, and the heating unit and the cooling unit are arranged in a spaced manner.

7. The temperature compensation system of claim 6, wherein when the second temperature value is less than a preset second target temperature, the distributed temperature control module controls the heating unit to perform temperature compensation adjustment on the temperature control compensation area corresponding to the second temperature value.

8. The temperature compensation system of claim 6, wherein when the second temperature value is greater than the preset second target temperature, the distributed temperature control module controls the cooling unit to perform temperature compensation adjustment on the temperature control compensation area corresponding to the second temperature value.

9. The temperature compensation system of claim 1, further comprising a temperature control plate arranged in the installation cavity, wherein the temperature control plate is located at a bottom end of the heating plate, a thermal insulation space is formed among the temperature control plate, the heating plate and an inner side wall of the installation cavity, and the distributed temperature control module and the auxiliary temperature adjustment module are both arranged in the thermal insulation space.

10. A semiconductor device, comprising the temperature compensation system of claim 1.

11. A temperature compensation method of the semiconductor device of claim 10, comprising the following steps:
   S0, providing a heating plate, a main heating module and an auxiliary temperature adjustment module, wherein at least one temperature control compensation area is arranged at a bottom surface of the heating plate, and the auxiliary temperature adjustment module and the temperature control compensation area are arranged in a correspondence manner;
   S1, performing temperature detection on the heating plate to obtain a first temperature value and a second temperature value;
   S2, controlling the main heating module to perform temperature adjustment on the heating plate according to the first temperature value;
   S3, controlling the auxiliary temperature adjustment module to perform temperature compensation adjustment on the temperature control compensation area according to the second temperature value.

12. The temperature compensation system of claim 6, further comprising a temperature control plate arranged in the installation cavity, wherein the temperature control plate is located at a bottom end of the heating plate, a thermal insulation space is formed among the temperature control plate, the heating plate and an inner side wall of the installation cavity, and the distributed temperature control module and the auxiliary temperature adjustment module are both arranged in the thermal insulation space.

* * * * *